United States Patent
Chakraborty et al.

(10) Patent No.: US 11,315,613 B2
(45) Date of Patent: Apr. 26, 2022

(54) MIXED MODE MULTIPLY AND ACCUMULATE ARRAY

(71) Applicant: International Business Machines Corporation, Armonk, NY (US)

(72) Inventors: Sudipto Chakraborty, Plano, TX (US); Rajiv Joshi, Yorktown Heights, NY (US); Steven J. Holmes, Ossining, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 16/806,375

(22) Filed: Mar. 2, 2020

(65) Prior Publication Data

US 2021/0272611 A1    Sep. 2, 2021

(51) Int. Cl.
| | |
|---|---|
| *G11C 7/10* | (2006.01) |
| *G11C 7/16* | (2006.01) |
| *G11C 11/56* | (2006.01) |
| *G11C 7/22* | (2006.01) |
| *G01R 33/36* | (2006.01) |

(52) U.S. Cl.
CPC ............ *G11C 7/16* (2013.01); *G01R 33/3607* (2013.01); *G11C 7/1057* (2013.01); *G11C 7/1072* (2013.01); *G11C 7/222* (2013.01); *G11C 11/5607* (2013.01); *G11C 11/5628* (2013.01)

(58) Field of Classification Search
CPC .............. G01R 33/3607; G11C 7/1057; G11C 7/1072; G11C 7/16; G11C 7/222; G11C 11/5607; G11C 11/5628

USPC ........ 327/100, 102, 103, 334, 355, 356, 359, 327/361
See application file for complete search history.

(56) References Cited

U.S. PATENT DOCUMENTS

| | | | | |
|---|---|---|---|---|
| 8,170,169 | B2* | 5/2012 | Martin | H03L 7/093 375/373 |
| 9,185,316 | B2* | 11/2015 | Cheon | H04N 5/3653 |
| 2014/0107857 | A1* | 4/2014 | Yang | G05B 19/0423 700/298 |
| 2015/0349944 | A1* | 12/2015 | Werker | H04L 7/033 375/371 |
| 2018/0173600 | A1 | 6/2018 | Delacruz et al. | |

(Continued)

OTHER PUBLICATIONS

Fumarola, A., et al., "Accelerating Machine Learning with Non-Volatile Memory: exploring device and circuit tradeoffs", 2016 IEEE International Conference on Rebooting Computing (ICRC), Date of Conference: Oct. 17-19, 2016, 8 pages, Conference Location: San Diego, CA.

*Primary Examiner* — William Hernandez
(74) *Attorney, Agent, or Firm* — Scully, Scott, Murphy & Presser, P.C.; Daniel P. Morris

(57) ABSTRACT

Systems and methods for operating a digital-to-analog converter (DAC) are described. In an example, a device can receive a digital input. The device can generate a clock signal having frequency in radio frequency (RF) range. The device can combine the digital input with the clock signal to generate a first voltage signal. The device can convert the first voltage signal into a second voltage signal having at least two phases. The device can convert the second voltage signal into a current signal. The device can distribute the current signal to at least one current mode DAC.

20 Claims, 6 Drawing Sheets

(56) References Cited

U.S. PATENT DOCUMENTS

2019/0088339 A1 3/2019 Miyashita et al.
2019/0108193 A1 4/2019 Buchanan

* cited by examiner

MIXED MODE MULTIPLY AND ACCUMULATE ARRAY

BACKGROUND

The present disclosure relates in general to hardware with analog-digital mixed mode architecture that can be implemented to perform various operations and algorithms.

In some examples, computer systems can include hardware that can be implemented to perform various operations, such as multiplication, addition, multiply and accumulate (MAC) operations, or other operations. The inputs to such hardware can be in digital form, and the hardware can include digital-to-analog converters (DACs) configured to convert the inputs into analog signals for further processing. DACs can be implemented with filters, such as reconstruction filters, to counter aliasing that can be caused by the conversion process.

SUMMARY

In some examples, a device that can implement a multiply and accumulate (MAC) unit is generally described. The device can include at least one current mode digital-to-analog converter (DAC), a signal generator, a frequency divider, and a buffer. The signal generator can be configured to generate a first voltage signal having frequency in radio frequency (RF) range. The frequency divider can be coupled to the signal generator, and the frequency divider can be configured to convert the first voltage signal into a second voltage signal having at least two phases. The buffer can be coupled to the frequency divider, and the buffer can be configured to convert the second voltage signal into a current signal. The buffer can be further configured to distribute the current signal to the at least one DAC.

In some examples, a system that can implement a multiply and accumulate (MAC) unit is generally described. The system can include a plurality of first devices and a second device. The second device can include at least one current mode digital-to-analog converter (DAC), a signal generator, a frequency divider, and a buffer. The signal generator can be configured to generate a first voltage signal having frequency in radio frequency (RF) range. The frequency divider can be coupled to the signal generator. The frequency divider can be configured to convert the first voltage signal into a second voltage signal having at least two phases. The buffer can be coupled to the frequency divider. The buffer can be configured to convert the second voltage signal into a current signal. The buffer can be further configured to distribute the current signal to the at least one DAC. The at least one DAC can be configured to output the current signal to the plurality of first devices.

In some examples, a method for operating a digital-to-analog converter (DAC) is generally described. The method can include receiving a digital input. The method can further include generating a clock signal having frequency in radio frequency (RF) range. The method can further include combining the digital input with the clock signal to generate a first voltage signal. The method can further include converting the first voltage signal into a second voltage signal having at least two phases. The method can further include converting the second voltage signal into a current signal. The method can further include distributing the current signal to at least one current mode DAC.

Further features as well as the structure and operation of various embodiments are described in detail below with reference to the accompanying drawings. In the drawings, like reference numbers indicate identical or functionally similar elements.

DETAILED DESCRIPTION

Figure 1:
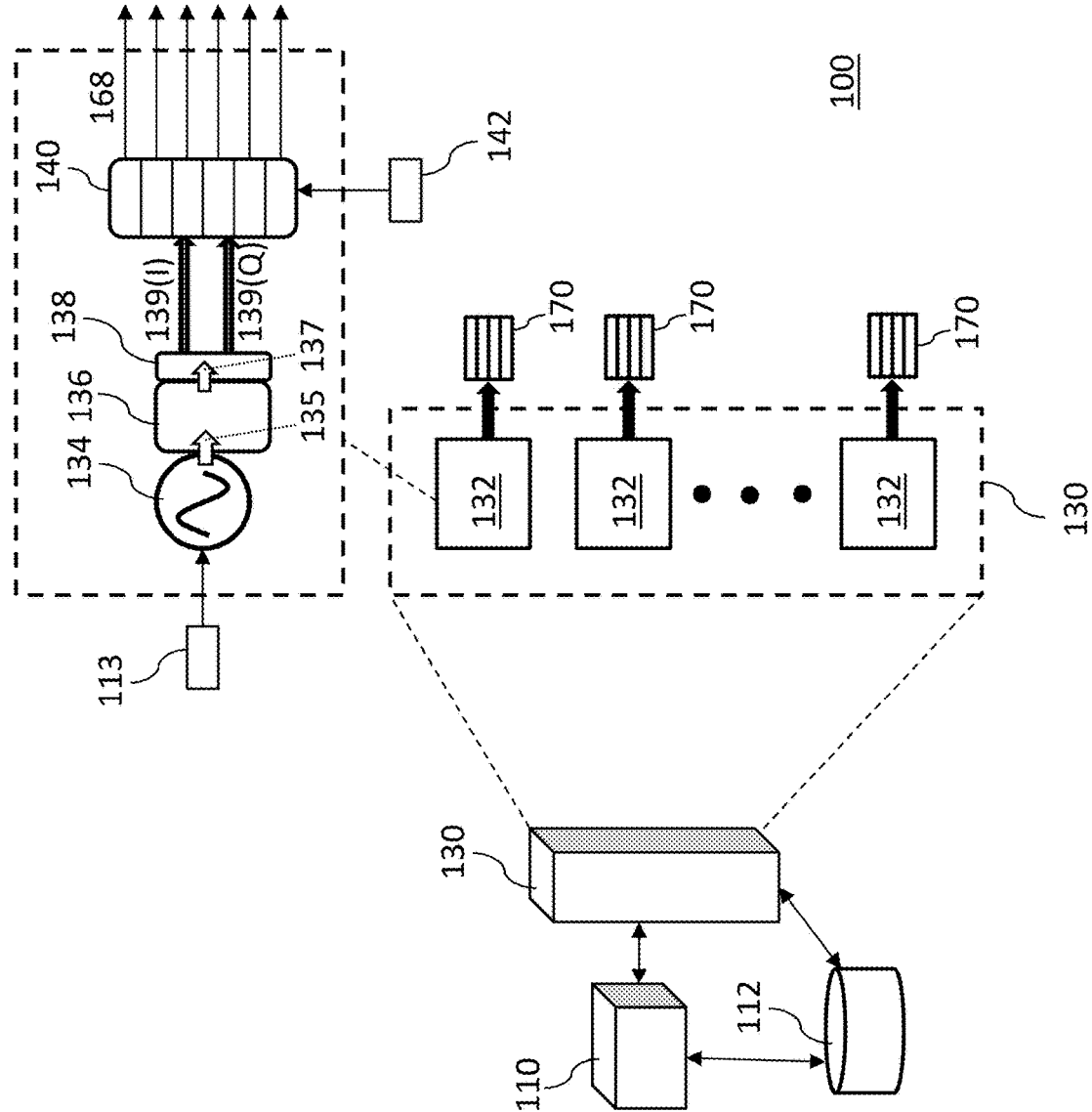
FIG. 1 is a diagram showing an example system that can implement a mixed mode multiply and accumulate array in one embodiment.

In some examples, hardware systems being used to implement MAC operations can include multiple active stages, such as using voltage mode DACs to convert direct current (DC current) to an intermediate frequency (IF frequency), using filters (e.g., such as anti-aliasing or reconstruction filters, or baseband filters, etc.) to cure noise and distortions caused by the DAC conversion, and using drivers to perform voltage-to-current conversion for amplification and transmission to other hardware. In some examples, for transmission purposes, the signals at the IF frequency may need to be upconvert to a higher frequency, such as radio frequency (RF). The conversion performed by voltage mode DACs can be non-linear due to high signal swing, and the voltage-to-current conversion by the driver can also reduce linearity. The non-linear nature of these conversions can cause an increase in power consumption by the hardware. The filters can also utilize a significant amount of power. In some examples, oversampling techniques can reduce filtering, but additional power is required for these oversampling techniques. In other examples, additional layers of filters can be used to perform lower oversampling, but the additional layers can increase device sizes and also increase the number of active stages.

The hardware systems described in accordance with the present disclosure can use digital to analog converters (DAC) with a radio frequency (RF) current source to implement a device that operates similarly to a radio frequency digital-to-analog converter (RF-DAC). An RF signal outputted from the device having the RF current source and the DACs can be distributed to an array of memory elements that may be implemented in current mode. The usage of the RF signal can allow a relatively large amount of memory elements to be integrated with low power. Further, the RF signal outputted from the device can be distributed with orthogonal phases, causing a wide variety of amplitude and phase variations to be realized and can lead to additional information storage. Readout from the memory elements can be performed by reconfiguring current sources without using area intensive operational amplifier. The device can also output analog signals that are already upconverted, eliminating the steps of heterodyning (e.g., conversion to IF) and upconverting the IF signals. Also, the usage of current mode devices can provide a direct interface with non-volatile memory elements, such as magnetoresistive random-access memory (MRAM) elements, by sharing current, and no additional bias current is needed.

In an example, a supply of electrical energy can be regulated under either voltage mode or current mode. Voltage mode references can provide a constant output voltage, and current mode references can provide a constant current into a variety of load voltage conditions. A voltage source can be used to regulate a supply in voltage mode, and a current source can be used to regulate a supply in current mode. The voltage change across switching components of a current mode DAC can be minimal, leading to improved linearity. Further, stray capacitance of a current mode DAC may not affect the speed of response of the circuit due to constant ladder node voltages.

FIG. 1 is a diagram showing an example system that can implement a mixed mode multiply and accumulate array in one embodiment. In the example shown in FIG. 1, a system 100 can include a processor 110, a memory 112, a structure 130, and a plurality of devices 170. The processor 110 can be, for example, a hardware processor, a controller, a central processing unit (CPU), a field-programming gate array (FPGA), a microprocessor, a microcontroller, and/or other types of hardware processing element. In some examples, the processor can be a component of a computing device, such as a desktop computer, laptop computer, tablet computer, and/or other types of computing devices. The plurality of devices 170 can be, for example, sensors, circuits, antennas, memory elements, and/or other types of devices. In an example embodiment, the devices 170 can be non-volatile memory (NVM) elements such as phase changing memory (PCM), ReRAM, and magnetoresistive random-access memory (MRAM) elements. In some examples, these NVM elements can be a part of the memory device 112 or can be coupled to the memory device 112. The processor 110 can be configured to provide inputs to the structure 130, receive outputs from the structure 130, and control the structure 130 to perform operations in mixed mode, such as multiplying digital signals with analog signals.

In the example shown in FIG. 1, the structure 130 can include an array of structures 132, such as circuits or circuit modules ("modules") 132. A module 132 can include a plurality of circuit elements. The modules 132 can include the same or different identical circuit elements. In an example, a module 132 can include a signal generator 134, a frequency divider 136, a buffer 138, and an array of circuits or circuit elements ("elements") 140. The frequency divider 136 can be, for example, an injection locked frequency divider, or a low voltage current mode logic (CML) divider. In some examples, the buffer 138 can be a cascode type buffer. In an example, a buffer can provide isolation between input and output, and can use different impedance systems (e.g., the input impedance can be different from the output impedance). A cascode buffer can provide isolation between input and output while sharing the same current between the functional block and the buffer. Some example advantages of the cascode buffer can be providing a high output impedance, improved high frequency isolation, and higher gain compared to a non-cascoded buffer. The array of elements 140 can include identical functional components and can operate in current mode. In an example, the elements 140 can be digital-to-analog converters (DAC), such as multiply and accumulate (MAC) units configured to perform MAC operations. An element 140 can include mixers, amplifiers, drivers, and/or other types of circuit components. In some examples, the system 100 can implement a transmitter or a transceiver, and the elements 140 can be connected to a plurality of transmission channels of the transmitter or the transceiver. A module 132 can include a respective set of elements 140, and the elements 140 can be coupled to (or connected to) devices 170. For example, one module 132 can include 16 units of element 140 associate with 16 transmission channels, and one transmission channel can be connected to one memory device (e.g., device 170).

In an example, the signal generator 134 can be realized using an RF source, such as by using an oscillator that may operate in voltage mode, and can output a voltage signal 135 (or signal 135) having constant output voltage and a frequency in the RF range. In some examples, a voltage signal can be a signal where its voltage is constant. The signal 135 outputted from the signal generator 134 can be transmitted to the frequency divider 136. The frequency divider 136 can be configured to reduce the frequency of the signal 135 by a factor, such as half, a quarter, one-eighth, etc. The frequency division performed by the frequency divider 136 can lead to generation of a voltage signal 137 (or signal 137) having multiple phases at low frequencies (e.g., frequencies lower than the frequency of signal 135). The signal 137 can be transmitted from the frequency divider 136 to the buffer 138. In an example, the buffer 138 can include a voltage-to-current converter (e.g., a switching circuit using a particular amount of current) configured to change the carrier of the signal 137 from voltage to current, resulting in a current signal 139 (or signal 139). In some examples, a current signal can be a signal where its current is constant. The signal 139 can be radio frequency (RF) current whose magnitude can be fixed current and whose frequency can be equivalent to the oscillator of the signal generator 134. The signal 139 can be an amplified version (e.g., amplified by the buffer 138) of the signal 137. The signal 139 can be provided or distributed to the elements 140, where the elements 140 can operate in current mode. In an example embodiment, the signal 139 can be provided to the elements 140 as an input signal at input terminals of the elements 140. In another example, the signal 139 can be provided to mixer components of the elements 140 (e.g., mixers in DACs).

In an example, the device 130 can receive an input 113, where the input 113 can be a digital signal including a bit stream corresponding to a center frequency. In an example embodiment, the processor 110 may control the structure 130 to perform a MAC operation associated with the input 113. In some examples, the input 113 can be received from a device external to the device 101. For example, the input 113 can be digital inputs received from another computing system (e.g., classical or quantum computing systems), or the input 113 can be digital signals representing regions of the touchscreen device that received pressure, or other types of digital signals. The input 113 can be combined with a clock signal or an oscillating signal generated by the oscillator of the signal generator 134, resulting in the signal 135. The clock signal generated by the oscillator can have a frequency in the RF range. For example, the input 113 can be a digital input having a particular frequency, and as a result of combining or mixing with the oscillating signal of the oscillator, the signal 135 can carry the information represented by the input 113 at a frequency of the oscillator. In an example where the oscillator is a RF source, the frequency of the oscillator can be in the RF range, resulting in the signal 135 carrying information represented by the input 113 in RF range. The frequency divider 136 and the buffer 138 can process the signal 135 (as described above) to generate the signal 139. The elements 140 can perform digital-to-analog conversion, such as by performing MAC operations on the signal 139 to generate the RF current 168 (or current 168). The current 168 can have time-varying current and can have an amplitude and phase modulation around the carrier frequency of the signal 139. The MAC operation being performed by the elements 140 can occurs in current mode, such as using wire connections to facilitate additions and subtractions, causing a reduction in a need to use active elements and voltage headroom requirements.

The frequency divider 136 and the buffer 138 can be stacked together (e.g., coupled or connected in a parallel configuration) to cause current being shared between the frequency divider and the buffer 138. For example, the frequency divider 136 and the buffer 138 can be stacked by having their supply rails being connected with each other in series configuration connection. In an example, the frequency divider 136 and the buffer 138 can be connected in a current shared configuration, with the buffer 138 being connected to ground, and the frequency divider 136 being connected to the supply voltages (e.g., from signal generator 134), and both blocks can share the same amount of current. This configuration can allow the amount of current that flows through the frequency divider 136 and the buffer 138 to be determined based on a topology of the frequency divider 136, the buffer 138, and the signal generator 134. Further, this configuration can allow the same current to flow through the frequency divider 136 and the buffer 138. Note that the connections of the frequency divider 136 and the buffer 138 can be interchangeable. For example, the frequency divider 136 and the buffer 138 can be connected in series, with frequency divider 136 being connected to ground, and the buffer 138 being connected to the supply (e.g., signal generator 134). Further, by having the buffer 138 as a stacked device, the buffer 138 can utilize low voltage headroom.

In an example embodiment, the frequency division performed by the frequency divider 136 can lead to generation of the signal 137 having multiple phases at frequencies lower than the frequency of signal 135. For example, the frequency divider 136 can output the signal 137 having two orthogonal phases, such as 0° and 90°, or 180° and 270°, referred to as an in-phase (I) component and a quadrature (Q) component. The frequency division can cause the buffer 138 to output individual I and Q components of the signal 139 to the elements 140. The I and Q components of the signal 139 can be orthogonal and can provide a wide variety of amplitude and phase variations to be realized and can lead to, for example, additional information storage if the devices 170 are memory elements. In an example, if a frequency of the input 113 is $F_{LO}$, and the division ratio of the frequency divider is N, then the output (e.g., signal 137) can have $F_{LO}/N$ phases, where a difference between adjacent phases can be 180/N. If there is any spurious signal around the input frequency $F_{LO}$, the frequency divider 136 can reduce that spurious tone by 20*log N factor. Further, the circuitry at the input of the frequency divider and the circuitry of the output of the frequency divider can occur at two different frequencies, leading to signal isolation.

In an example, the modules 132 can include different components to provide differential outputs to the devices 170. For example, a first module 132 can have a signal generator 134 configured to upconvert the input 113 to a first frequency, and a second module 132 can have another signal generator 134 configured to upconvert the input 113 to a second frequency different from the first frequency. By having different components or different configuration for similar components among the modules 132, different signals 168 can be distributed to different devices 170, providing flexibility to various applications being implemented by the system 100. In another example, a system that uses differential inputs can have greater immunity to substrate noise and other mechanisms of electromagnetic crosstalk. Some example systems that can use differential inputs include wireless communication systems, quantum computing systems, etc. Signal can be distributed differentially, or the distribution can be single ended, and a single ended to differential conversion can be done at the signal slice using, for example, baluns and/or transformers.

In an example, the signal 139 can be sent to the elements 140 to perform MAC operations. For example, each element 140 can include a first mixer to combine the I component of the signal 139 with an I component of a signal 142, and a second mixer to combine the Q component of the signal 139 with a Q component of the signal 142. The signal 142 can be digital or analog signal. An output current 168 can be produced from the first and second mixers among the circuits 140, and can be transmitted to a corresponding device 170. In an example, the signal 142 can represent a plurality of weights of an artificial neural network, and the input 113 can represent an input to a machine learning model. The plurality of weights can be stored in the memory 112, or in some examples, in the devices 170 (if devices 170 are memory elements). The MAC operation between the input 113 and the signal 142 can facilitate implementation of a machine learning model such as, for example, classification of the input 113. Further, if devices 170 are non-volatile memory (NVM) elements such as MRAM, ReRAM elements, the output current 168 can be applied to the MRAM elements to write to the MRAM elements and/or to update data (e.g., weights) that may be stored in the MRAM elements. By utilizing the system 100 to implement artificial neural networks, computations such as multiplications, additions, and multiply and accumulate operations can be performed with improved performance such as lower power consumption and improved linearity of the signals being processed by the system 100. Further, the system 100 can implement mixed mode multiplication (e.g., multiplying digital signals with analog signals). For example, the input 113 can be a digital input signal and the signal 142 can be an analog signal. By implementing the modules 132 with the elements 140, the device 130 can be configured to operate as a RF-DAC and may need not to upconvert the input 113, causing improved power consumption.

In another example, the utilization of RF source in the signal generator 134 can allow the module 132 to avoid using mixers with a local oscillator (e.g., heterodyning), which reduces an amount of signal processing and power consumption. For example, the utilization of the RF source can eliminate a need to generate signals having intermediate frequency (IF) and upconverting the signals with IF to signals having RF. The elements 140 can include components such as transformers and matching networks to facilitate transmission of the output current 168 to the devices 170.

Figure 2:
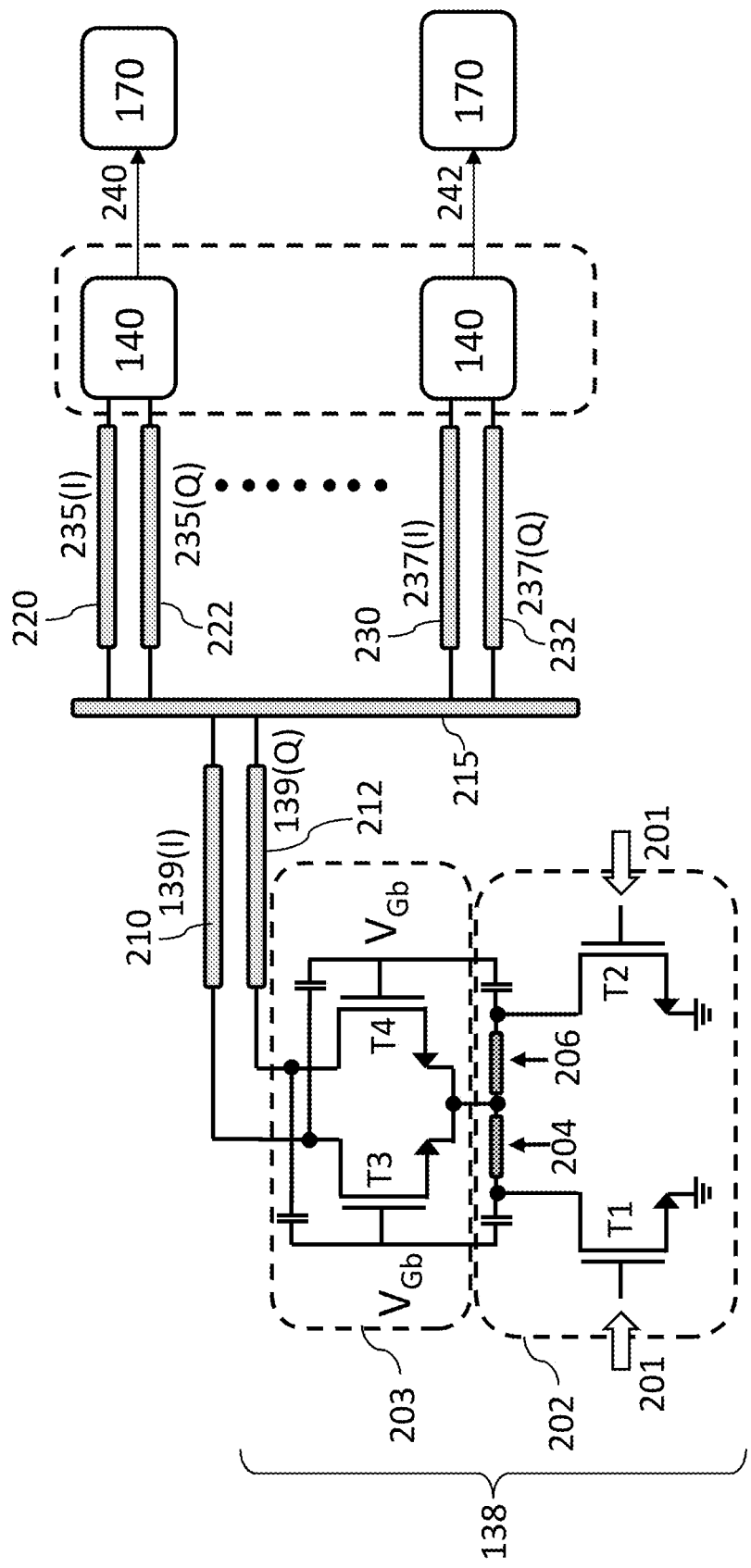
FIG. 2 is a diagram showing details of a module implemented by a mixed mode multiply and accumulate array in one embodiment.

FIG. 2 is a diagram showing details of a module implemented by a mixed mode multiply and accumulate array in one embodiment. In an example in FIG. 2, a portion 202 of the buffer 138 and a portion 203 of the buffer 138 are shown. The portion 202 can include a pair of transistors T1 and T2 connected in parallel via a pair of transmission lines 204 and 206. The transistors T1 and T2 can be field-effect transistors (FETs), such as metal-oxide-semiconductor field-effect transistors (MOSFETs). In an example embodiment, the transistors T1 and T2 can be N-type FETs. The transistors T1 and T2 can be activated by a voltage 201, where the voltage 201 can be, for example, analog-to-digital (ADC) voltage outputted from the signal generator 134 or the frequency divider 136. If the signal generator 134 is directly coupled to the buffer 138 (e.g., transformer coupling or alternating current (AC) coupled), the voltage 201 can be voltage of the signal 135. If the frequency divider 136 is coupled between the signal generator 134 and the buffer 138, the voltage 201 can be the signal 137 with orthogonal phases, where each phase (among the I and Q component) can be applied to the gate terminals of the transistors T1 and T2, respectively. The I component of the signal 137 (outputted from the frequency divider 136) can flow through one of the transistors T1 and T2, and the Q component of the signal 137 can flow through the other one of the transistors T1 and T2. In some examples, the I and Q components of the signal 137 can be transmitted in a single transmission line.

The portion 203 can include a pair of transistors T3 and T4 connected in cascade. The transistors T3 and T4 can be field-effect transistors (FETs), such as metal-oxide-semiconductor field-effect transistors (MOSFETs). In an example embodiment, the transistors T3 and T4 can be N-type FETs. The I component of the signal 137 can flow through one of the transistors T3 and T4, and the Q component of the signal 137 can flow through the other one of the transistors T3 and T4. The buffer 138 can be arranged in a stack configuration with the frequency divider 136, such as being stacked or disposed on top of one another directly or indirectly. The stack configuration allows current to be shared between the buffer 138 and the frequency divider 136. A voltage $V_{Gb}$ can be bias voltage being applied to the transistors T3 and T4 to maintain these transistors in the strong inversion biasing regime. The constant current sharing between the buffer 138 and the frequency divider 136 allows the buffer 138 and the frequency divider 136 to operate in current mode, causing a reduction of power consumption by the system 100.

The buffer 138 can distribute the signal 139 to a transmission line 215 via a pair of transmission lines 210 and 212. The transmission line 210 can transmit the I component of the signal 139 and the transmission line 212 can transmit the Q component of the signal 139. In some examples, the I and Q components of the signal 139 can be transmitted in a single transmission line. The transmission line 215 can facilitate distribution of the I and Q components of the signal 139 to elements 140. The elements 140 can receive the same I and Q components of the signal 139 but can be configured to output different output current 168. For example, a first module (e.g., 132) can output a first RF signal that leads to generation of a signal 235. A second module (e.g., 132) can output a second RF signal that leads to generation of a signal 237. The signal 235 can be transmitted to one of the elements 140 via a pair of transmission lines 220 and 222, and the element 140 receiving the signal 235 can generate the output current 240 for one of the devices 170. In some examples, the I and Q components of the signal 235 can be transmitted in a single transmission line. The signal 237 can be transmitted to another one of the elements 140 via a pair of transmission lines 230 and 232, and the element 140 receiving the signal 237 can generate the output current 242 for another one of the devices 170. In some examples, the I and Q components of the signal 237 can be transmitted in a single transmission line. The differential outputs among the modules 132 can lead to differential output currents from the elements 140 to the devices 170.

Figure 3:
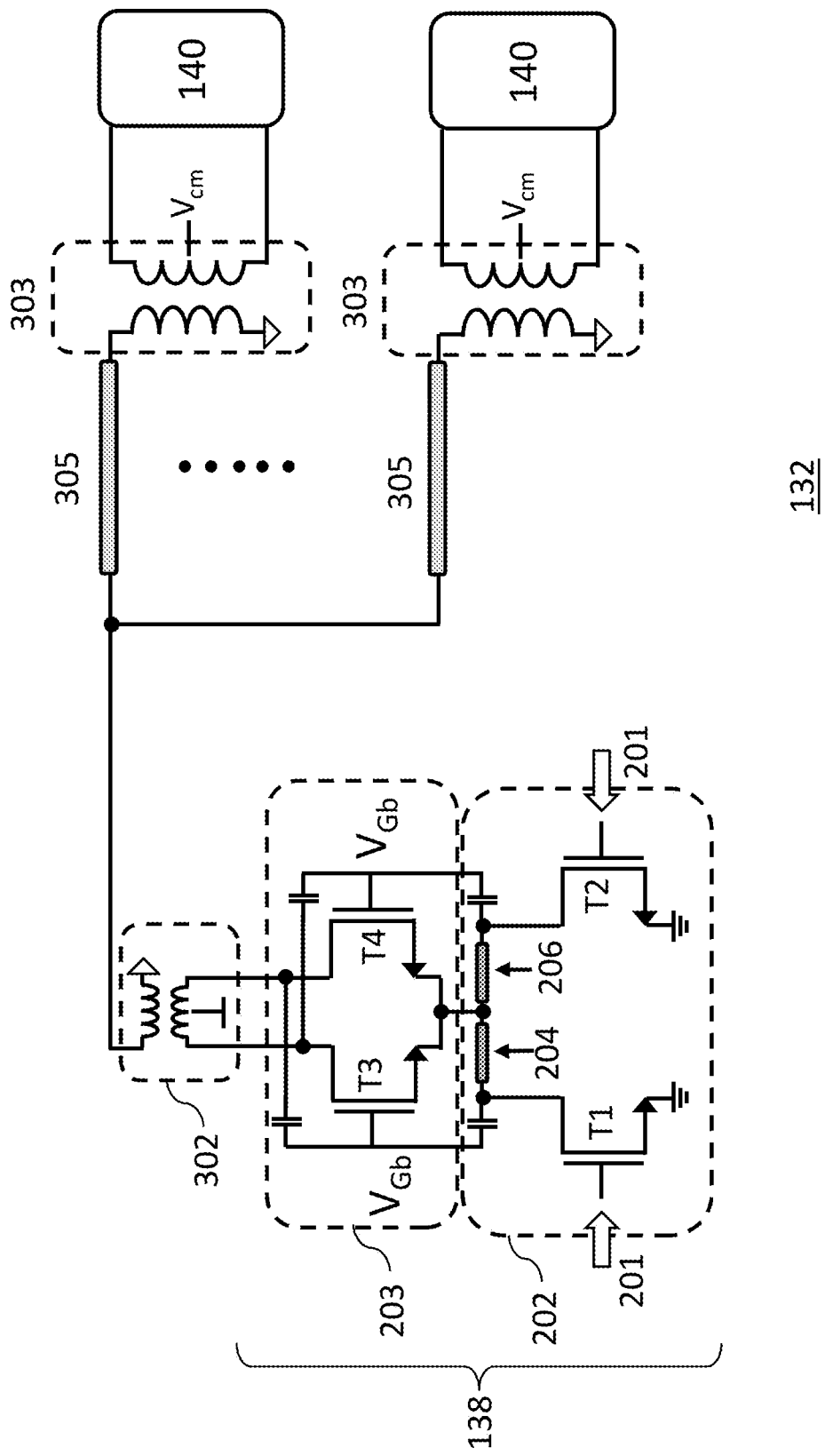
FIG. 3 is a diagram showing additional details of a module implemented by a mixed mode multiply and accumulate array in one embodiment.

FIG. 3 is a diagram showing additional details of a module implemented by a mixed mode multiply and accumulate array in one embodiment. In the example embodiment shown in FIG. 3, the output of the buffer 138 can be connected to a transformer 302. The input of the elements 140 can be connected to a respective transformer 303. If the module 132 includes k units of elements 140, then there can be k units of transformers 303 connected to the elements 140. The transformer 302 connected to the buffer 138 can convert the differential signals (e.g., signal 137 having multiple phases) to a single end signal. The transformers 303 can receive this single end signal, via respective transmission lines 305, and convert the received single end signal back to differential signals having multiple phases. The example embodiment shown in FIG. 3 can reduce routing complexity by having reduced number of transmission lines and consuming less area. Further, direct current (DC) isolation can be achieved between the coils of the transformers 302 and 303.

Figure 4:
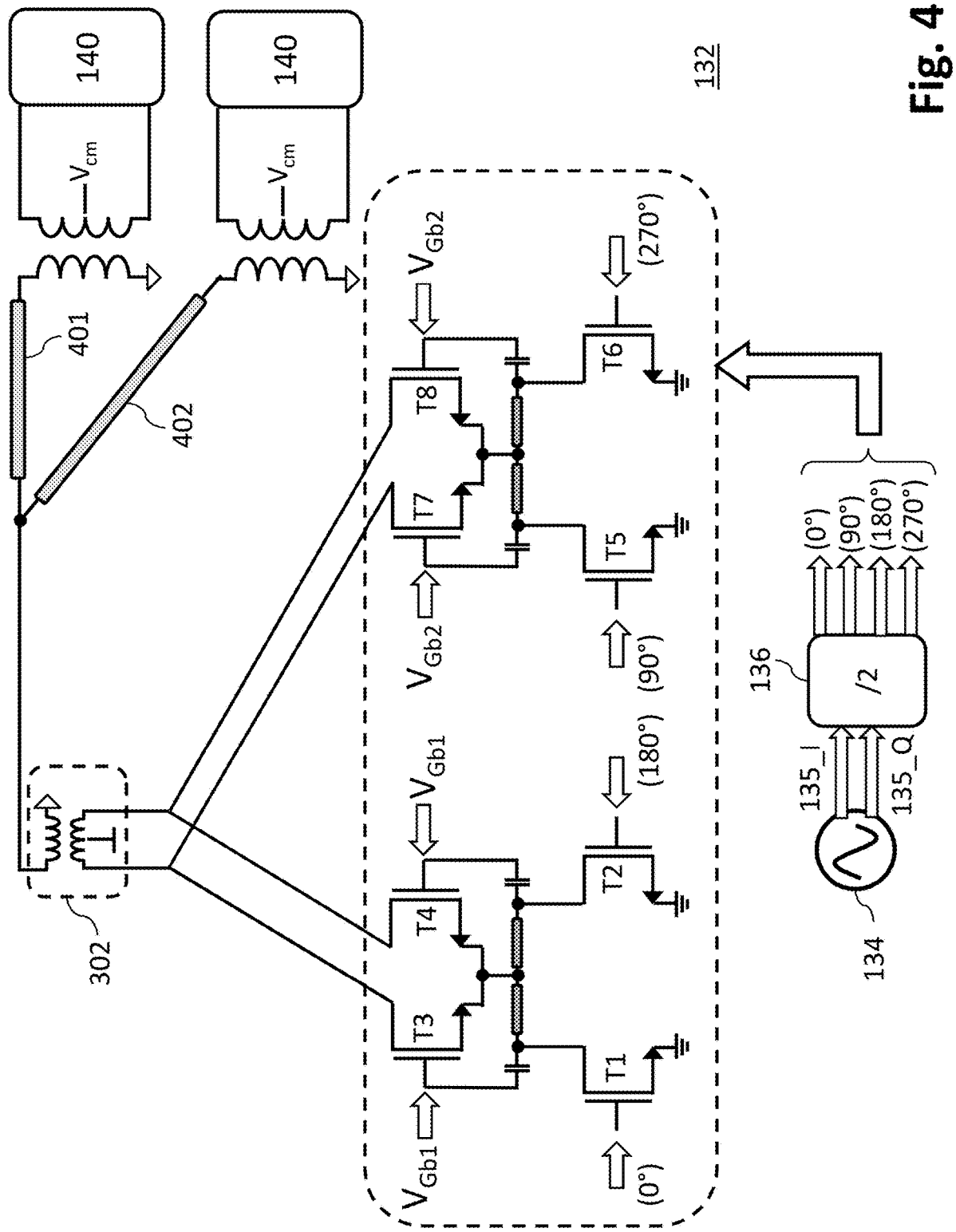
FIG. 4 is a diagram showing additional details of a module implemented by a mixed mode multiply and accumulate array in one embodiment.

FIG. 4 is a diagram showing details of a module implemented by a mixed mode multiply and accumulate array in one embodiment. In the example embodiment shown in FIG. 3, the buffer 138 can include different circuit portions configured to scale different phases of the signal outputted from the frequency divider 136 (e.g., signal 137). For example, the I component of the voltage signal 135 (135_I) and the Q component of the voltage signal 135 (135_Q) can be generated by the signal generator 134. The frequency divider 136 can be configured to perform frequency division on the signals 135_I and 135_Q to generate the signal 137 having multiple phases at 0°, 90°, 180°, and 270°. In the example shown in FIG. 4, the buffer 138 can include four input ports configured to receive the signal 137 at the four phases 0°, 90°, 180°, and 270°. A bias voltage $V_{Gb1}$ can be applied to the transistors T3 and T4 to scale and adjust the phases 0° and 180° of the signal 137. Another bias voltage $V_{Gb2}$ can be applied to the transistors T7 and T8 to scale and adjust the phases 90° and 270° of the signal 137. The example embodiment shown in FIG. 4 can adjust the phases of the signal 139 being transmitted to the elements 140 by adjusting the different bias voltages $V_{Gb1}$ and $V_{Gb2}$. In another example embodiment, different amount of phase shifts can be realized by having transmission lines of different lengths connected to different elements 140. For example, a transmission line 401 can be shorter than a transmission line 402, where the signal being transmitted using the transmission line 402 can result in a greater delay or phase shift. As a result, the elements 140 can receive phased shifted signals. In an example, machine learning systems and quantum computing devices may operate using these phase shifted signals. For example, the phase shifted signals can represent different states of a qubit being inputted into a quantum computing system.

Figure 5:
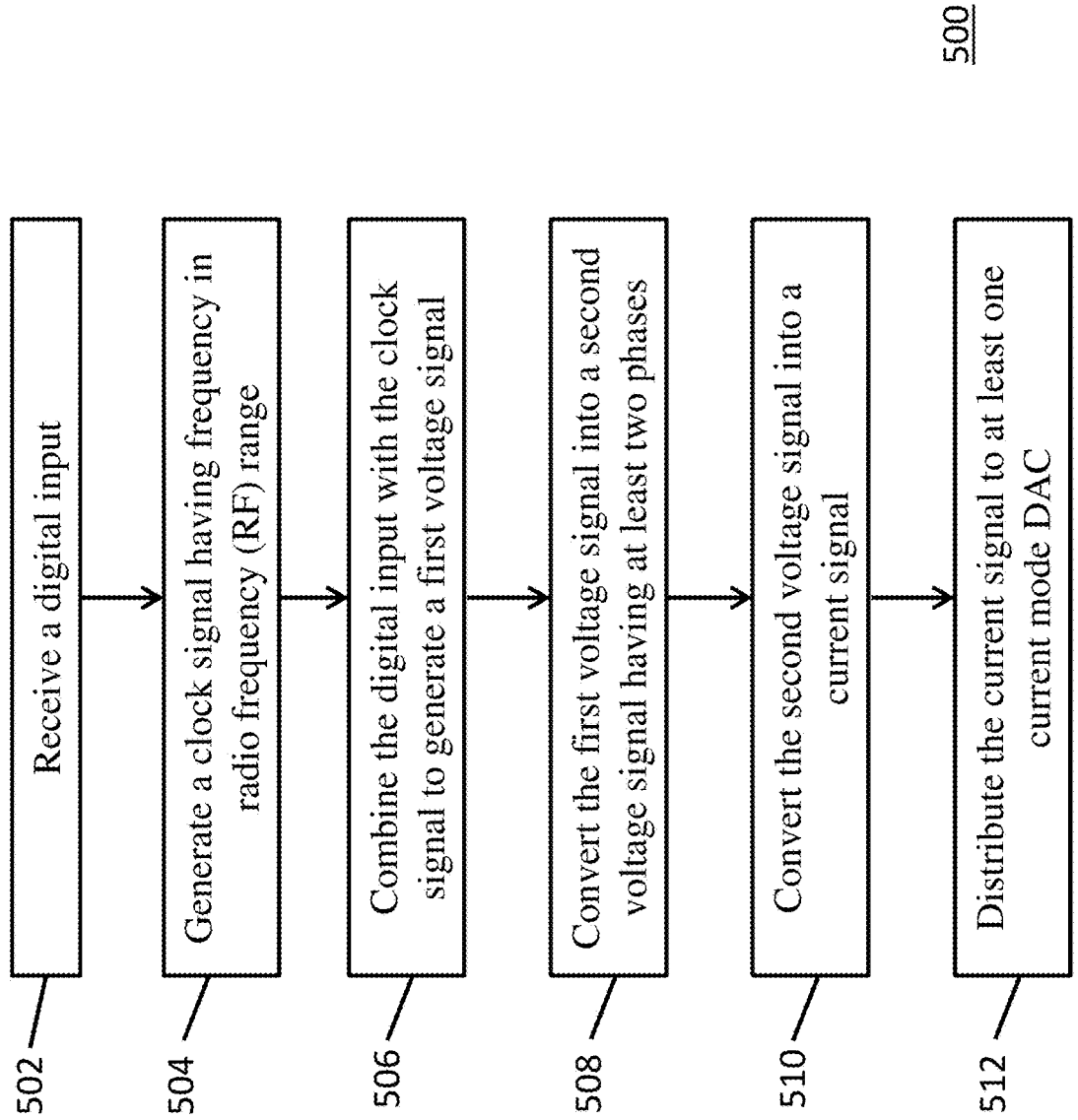
FIG. 5 is a flow diagram illustrating a method of implementing a mixed mode multiply and accumulate array in one embodiment.

FIG. 5 is a flow diagram illustrating a method of implementing a process 500 and a mixed mode multiply and accumulate array in one embodiment. An example process may include one or more operations, actions, or functions as illustrated by one or more of blocks 502, 504, 506, 508, 510, and/or 512. Although illustrated as discrete blocks, various blocks can be divided into additional blocks, combined into fewer blocks, eliminated, or performed in parallel, depending on the desired implementation.

The process 500 can begin at block 502. At block 502, a device can receive a digital input. The process 500 can continue from block 502 to block 504. At block 504, the device can generate a clock signal having frequency in radio frequency (RF) range. The process 500 can continue from block 504 to block 506. At block 506, the device can combine the digital input with the clock signal to generate a first voltage signal. The process 500 can continue from block 506 to block 508. At block 508, the device can convert the first voltage signal into a second voltage signal having at least two phases, where the at least two phases can be orthogonal.

The process 500 can continue from block 508 to block 510. At block 510, the device can convert the second voltage signal into a current signal. The process 500 can continue from block 510 to block 512. At block 512, the device can distribute the current signal to at least one current mode DAC. In some examples, the device can store the current signal in at least one non-volatile memory (NVM) elements, such as magnetoresistive random-access memory (MRAM) elements.

Figure 6:
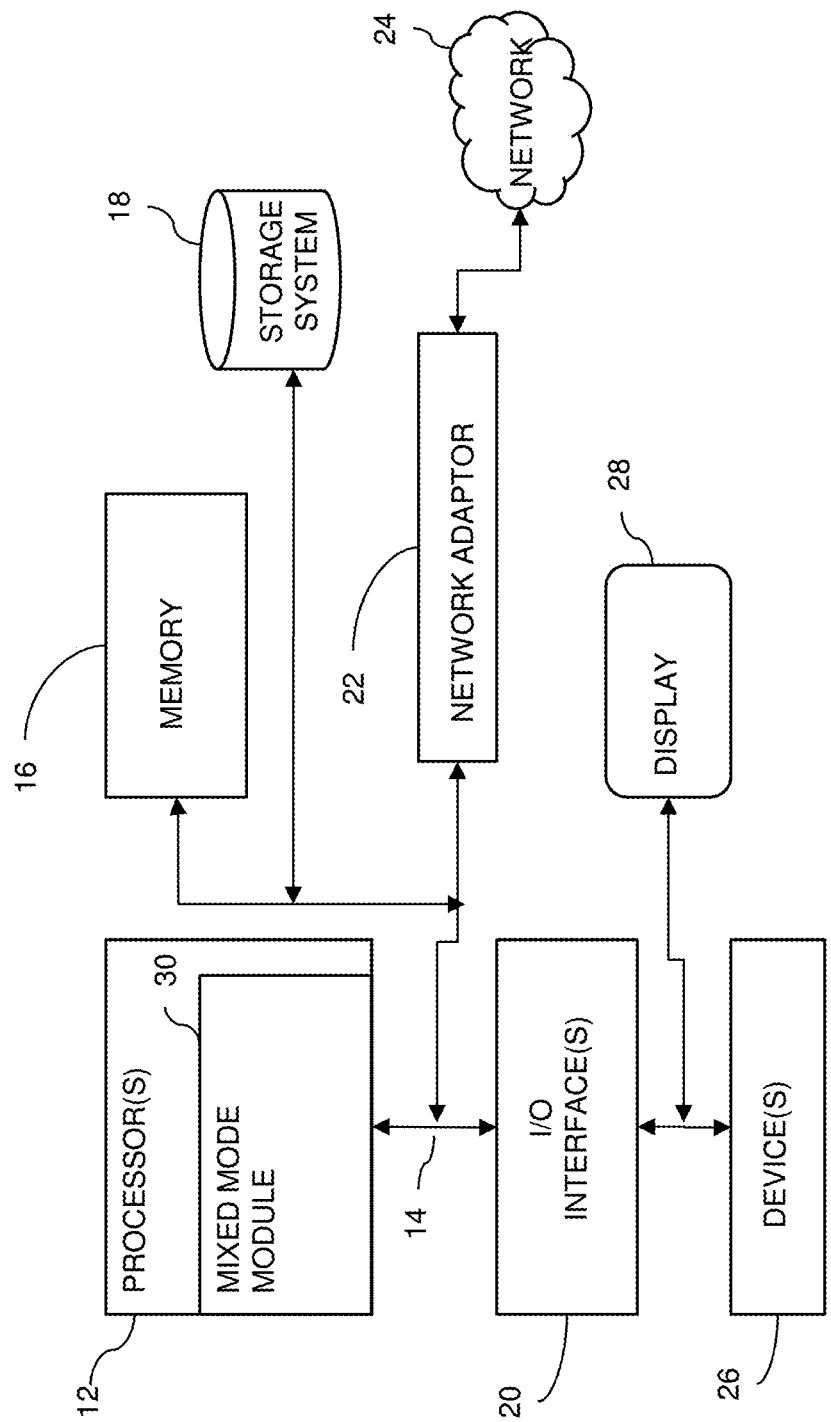
FIG. 6 is a diagram showing details of a module implemented by a mixed mode multiply and accumulate array in one embodiment.

FIG. 6 illustrates a schematic of an example computer or processing system that may implement a mixed mode multiply and accumulate array in one embodiment. The computer system is only one example of a suitable processing system and is not intended to suggest any limitation as to the scope of use or functionality of embodiments of the methodology described herein. The processing system shown can be operational with numerous other general purpose or special purpose computing system environments or configurations. Examples of well-known computing systems, environments, and/or configurations that can be suitable for use with the processing system shown in FIG. 3 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system can be described in the general context of computer system executable instructions, such as program modules, being executed by a computer system. Generally, program modules may include routines, programs, objects, components, logic, data structures, and so on that perform particular tasks or implement particular abstract data types. The computer system can be practiced in distributed cloud computing environments where tasks are performed by remote processing devices that are linked through a communications network. In a distributed cloud computing environment, program modules can be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., mixed mode module 30) that performs the methods described herein. The module 30 can be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media can be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention can be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device comprising:
   at least one current mode digital-to-analog converter (DAC);
   a signal generator configured to generate a first voltage signal having a frequency within radio frequency (RF) range;
   a frequency divider coupled to the signal generator, the frequency divider being configured to convert the first voltage signal into a second voltage signal having at least two phases; and
   a buffer coupled to the frequency divider, the buffer being configured to:
      convert the second voltage signal into a current signal; and
      distribute the current signal to the at least one DAC.

2. The device of claim 1, wherein the buffer is a cascode type buffer.

3. The device of claim 1, wherein the frequency divider is one of:
   an injection locked frequency divider, and
   a low voltage current mode logic (CML) divider.

4. The device of claim 1, wherein the at least two phases are orthogonal.

5. The device of claim 1, wherein the at least one DAC is coupled to a plurality of non-volatile memory (NVM) elements.

6. The device of claim 5, wherein the NVM elements are magnetoresistive random-access memory (MRAM) elements.

7. The device of claim 1, wherein the signal generator comprises an oscillator configured to generate a clock signal, the signal generator is configured to receive a digital input, and the signal generator is configured to combine the digital input with the clock signal to generate the first voltage signal.

8. The device of claim 1, wherein:
   the buffer comprises a first transformer, and the buffer is configured to convert the current signal into a single end signal using the first transformer; and
   the at least one DAC comprises a second transformer configured to receive the single end signal from the buffer, and the second transformer is further configured to convert the single end signal into a differential signal having the at least two phases.

9. A system comprising:
   a plurality of first devices;
   a second device comprising:
      at least one current mode digital-to-analog converter (DAC);
      a signal generator configured to generate a first voltage signal having a frequency within radio frequency (RF) range;
      a frequency divider coupled to the signal generator, the frequency divider being configured to convert the first voltage signal into a second voltage signal having at least two phases; and
      a buffer coupled to the frequency divider, the buffer being configured to:
         convert the second voltage signal into a current signal; and
         distribute the current signal to the at least one DAC;
      the at least one DAC being configured to output the current signal to the plurality of first devices.

10. The system of claim 9, wherein the buffer is a cascode type buffer.

11. The system of claim 9, wherein the frequency divider is one of:
    an injection locked frequency divider, and
    a low voltage current mode logic (CML) divider.

12. The system of claim 9, wherein the at least two phases are orthogonal.

13. The system of claim 9, wherein the plurality of first devices is a plurality of non-volatile memory (NVM) elements.

14. The system of claim 13, wherein the NVM elements are magnetoresistive random-access memory (MRAM) elements.

15. The system of claim 9, wherein the signal generator comprises an oscillator configured to generate a clock signal, the signal generator is configured to receive a digital input, and the signal generator is configured to combine the digital input with the clock signal to generate the first voltage signal.

16. The system of claim 9, wherein:
    the buffer comprises a first transformer, and the buffer is configured to convert the current signal into a single end signal using the first transformer; and
    the at least one DAC comprises a second transformer configured to receive the single end signal from the buffer, and the second transformer is further configured to convert the single end signal into a differential signal having the at least two phases.

17. A method for operating a digital-to-analog converter (DAC), the method comprising:
    receiving a digital input;
    generating a clock signal having a frequency within radio frequency (RF) range;
    combining the digital input with the clock signal to generate a first voltage signal;
    converting the first voltage signal into a second voltage signal having at least two phases;
    converting the second voltage signal into a current signal; and
    distributing the current signal to at least one current mode DAC.

18. The method of claim 17, wherein the at least two phases are orthogonal.

19. The method of claim 17, further comprising storing the current signal in at least one non-volatile memory (NVM) elements.

20. The method of claim 19, wherein the at least one NVM elements are magnetoresistive random-access memory (MRAM) elements.

* * * * *